United States Patent
Wu et al.

(10) Patent No.: US 6,303,482 B1
(45) Date of Patent: Oct. 16, 2001

(54) METHOD FOR CLEANING THE SURFACE OF A SEMICONDUCTOR WAFER

(75) Inventors: Chih-Ning Wu, Hsin Chu; Chan-Lon Yang, Taipei, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/597,762

(22) Filed: Jun. 19, 2000

(51) Int. Cl.⁷ .................................................. H01L 21/3205
(52) U.S. Cl. ...................... 438/592; 510/108; 510/175; 510/176
(58) Field of Search ............................ 438/592; 510/108, 510/175, 176

(56) References Cited

U.S. PATENT DOCUMENTS

| | | | |
|---|---|---|---|
| 5,086,017 | * | 2/1992 | Lu .................................... 437/200 |
| 5,346,586 | * | 9/1994 | Keller ................................ 156/656 |
| 5,723,352 | * | 3/1998 | Shih et al. ........................... 437/44 |
| 5,814,155 | * | 9/1998 | Solis et al. ........................... 134/1 |
| 5,877,057 | * | 3/1999 | Gardner et al. ...................... 438/301 |
| 6,004,843 | * | 12/1999 | Huang ............................... 438/241 |
| 6,030,932 | * | 2/2000 | Leon et al. .......................... 510/175 |

* cited by examiner

*Primary Examiner*—John F. Niebling
*Assistant Examiner*—Olivia Luk
(74) *Attorney, Agent, or Firm*—Winston Hsu

(57) ABSTRACT

A method for cleaning the surface of a semiconductor wafer is disclosed. A plasma ashing process is performed on the surface of the semiconductor wafer. The plasma ashing process is performed in a chamber that contains oxygen and carbon tetrafluoride ($CF_4$). An ozone-containing deionized (DI) water cleaning procedure, an amine-based solvent cleaning procedure and a fluoride-based solvent cleaning procedure are then performed to clean the surface of the semiconductor wafer without over-etching the silicon oxide of the street. Finally, an oxygen plasma cleaning process is performed to remove any residual photo-resist.

16 Claims, 4 Drawing Sheets

METHOD FOR CLEANING THE SURFACE OF A SEMICONDUCTOR WAFER

BACKGROUND OF THE INVENTION

1. Field of the Invention

The present invention relates to a method for cleaning the surface of a semiconductor wafer. More particularly, the present invention relates to a method for completely removing both a photo-resist layer and residual polymers on the surface of the semiconductor wafer after performing an etching process, wherein the photo-resist layer acts as a hard mask during the etching process.

2. Description of the Prior Art

Metal-oxide-semiconductor (MOS) transistors have played a significant role in the integrated circuit industry, and the electrical performance of the gate electrodes of MOS transistors is important to the quality of the MOS transistors. In the process of forming the gate electrodes, a gate oxide layer, a polycide layer and a silicide layer are sequentially formed on the surface of a silicon substrate. Patterns of the gate electrodes are then defined by a photo-resist layer, and the gate electrodes are completed using an etching process. Remaining photo-resist and residual polymers formed during the etching process on the surface of the semiconductor wafer must be removed after the etching process to ensure the electrical performance of the MOS transistors.

Please refer to FIG. 1 and FIG. 2. FIG. 1 and FIG. 2 are cross-sectional diagrams of a method for defining a gate electrode 11 on a semiconductor wafer 10 by virtue of a photo-resist layer 20. As shown in FIG. 1, a silicon substrate 12 of the semiconductor wafer 10 is subjected to a thermal oxidation process. The surface of the silicon substrate 12 is oxidized in the thermal oxidation process to form a gate oxide layer 14 with a thickness of about 80 angstroms to 200 angstroms. A low-pressure chemical vapor deposition (LPCVD) process is then performed with silane ($SiH_4$) as a reaction gas at a temperature of about 575° C. to about 650° C. to form a polysilicon layer 16 with a thickness of about 1000 angstroms to 1500 angstroms over the gate oxide layer 14. A metal silicide layer 18 composed of titanium-polycide is next deposited on the surface of the polysilicon layer 16. The thickness of the metal silicide layer 18 is in a range of about 1000 angstroms to about 1500 angstroms. Thereafter, a photo-resist layer 20 is spin-coated over the metal silicide layer 18 and patterned using a conventional lithographic process to define the gate electrodes.

Next, as shown in FIG. 2, a plasma etching process is performed to vertically etch the metal silicide layer 18, the polysilicon layer 16 and the gate oxide layer 14 that are not covered by the photo-resist layer 20 down to the surface of the silicon substrate 12 so as to complete the gate electrodes 11.

The photo-resist layer 20 has polymeric resins, photo-sensitizers and organic solvents. After the etching process, residual polymers 22, whose composition is still unknown and is under investigation, are usually observed on the walls of the gate electrodes 11 and in the corners between the gate electrodes 11 and the silicon substrate 12. Also, the remaining photo-resist layer 20 must be removed. Consequently, an effective surface cleaning process is necessary to remove both the residual polymers 22 and the remaining photo-resist layer 20 from the surface of the semiconductor wafer 10.

The cleaning process of the prior art method includes: a) performing a dry etching process using an ashing plasma, such as an oxygen plasma; b) performing a wet cleaning process using a fluoride-based solvent, such as EKC 640, or an amine-based solvent. The oxygen plasma in the dry etching process oxidizes and decomposes most of the remaining photo-resist layer 20 and most residual polymers 22 into gaseous CO, $CO_2$ and $H_2O$. The gaseous CO, $CO_2$ and $H_2O$ are concurrently extracted using a vacuum system (not shown). After the dry etching process, trace amounts of photo-resist and polymers, most likely organic metal compounds, remain on the surface of the semiconductor wafer 10 after the dry etching process. After performing the wet cleaning process using a fluoride-based solvent, the trace polymers are dissolved. Finally, the solvent and dissolved solutes are removed using deionized (DI) water so as to complete the cleaning of the semiconductor wafer 10.

However, it is disadvantageous to use a fluoride-based solvent or only an amine-based solvent in the wet cleaning process. Although the fluoride-based solvent has significant cleaning abilities, it also slightly corrodes the metal silicide layer 18 and the silicon oxide concurrently formed on the test key on the street in the earlier thermal oxidation process. Manufacturers can not detect the thickness of the remaining silicon oxide directly from the gate electrodes 11. The test key is therefore used as a window from which an optical device can detect the remaining thickness of the silicon oxide in the test key after the cleaning process. The remaining thickness of the silicon oxide is used to monitor and evaluate the efficiency of the entire cleaning process. Once the silicon oxide in the test key has been overly eroded or etched, it is difficult to control the quality of the semiconductor products being manufactured in the subsequent cleaning processes.

In addition, using fluoride-based solvents will cause a serious etching rate problem. Please refer to FIG. 3. FIG. 3 depicts the relationship of thermal oxide etching rate versus bath time. As shown in FIG. 3, the x-axis represents the bath time of the semiconductor monitor wafer (not shown) in a fluoride-based solvent, and the y-axis represents the etching rate of the thermal oxide formed on the surface of the monitor wafer. The etching rate of the thermal oxide using the fluoride-based solvent increases as the bath time increases. This is because the pH value of the fluoride-based solvent decreases as the bath time increases. The increasing etching rate makes the cleaning process unpredictable and exacerbates the erosion of the silicon oxide of the street. On the other hand, an amine-based solvent does not have the above-mentioned problems owing to its pH stability during the cleaning process. However, amine-based solvents show an inadequate cleaning ability for the residual polymers 22 on the surface of the semiconductor wafer 10.

SUMMARY OF THE INVENTION

It is therefore a primary objective of this invention to provide an economical method for cleaning the surface of a semiconductor wafer without damaging devices on the surface of the semiconductor wafer.

Another objective of the present invention is to provide a method for effectively removing the remaining photo-resist and residual polymers from the surface of a semiconductor wafer after an etching process.

Still another objective of the present invention is to provide a more reliable semiconductor wafer cleaning method for preventing over-etching of the silicon oxide in the test key on the street so as to control the quality of the cleaning process.

Basically, in accordance with this invention, the method is used to completely remove residual polymers and remaining photo-resist after performing a dry etching process on the surface of the semiconductor wafer. The semiconductor wafer comprises a plurality of defined gate electrodes on the surface of the semiconductor wafer and a photo-resist layer on each of the defined gate electrodes. Each gate electrode comprises a gate oxide layer on the surface of the semiconductor wafer, a polysilicon layer on the gate oxide layer, and a silicide layer on the polysilicon layer.

A plasma ashing process is initially performed on the surface of the semiconductor wafer. The plasma ashing process is performed in a chamber that contains oxygen and carbon tetrafluoride ($CF_4$). A wet cleaning process comprising an ozone-containing deionized (DI) water cleaning procedure, a fluoride-based solvent cleaning procedure and an amine-based solvent cleaning procedure is then performed to clean the surface of the semiconductor wafer. Finally, an oxygen plasma process is performed to remove any residual photo-resist.

According to one aspect of this invention, the present invention uses a different wet cleaning process from the prior art method to clean the surface of the semiconductor wafer. The wet cleaning process according to the present invention comprises an ozone-containing deionized (DI) water cleaning procedure, a fluoride-based solvent cleaning procedure and an amine-based solvent cleaning procedure. Ozone-containing deionized (DI) water effectively decomposes and removes residual polymers from the surface of the semiconductor wafer without damaging the metal silicide layer, the silicon oxide of the street or other devices on the surface of the semiconductor wafer, while the amine-based solvent ensures a steady pH value during the wet cleaning process so as to control the etching rate and the final quality of the semiconductor product. The usage of the fluoride-based solvent further ensures the thickness of the silicon oxide in the test key to fall in the range of the criteria as well as the quality of the semiconductor product.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
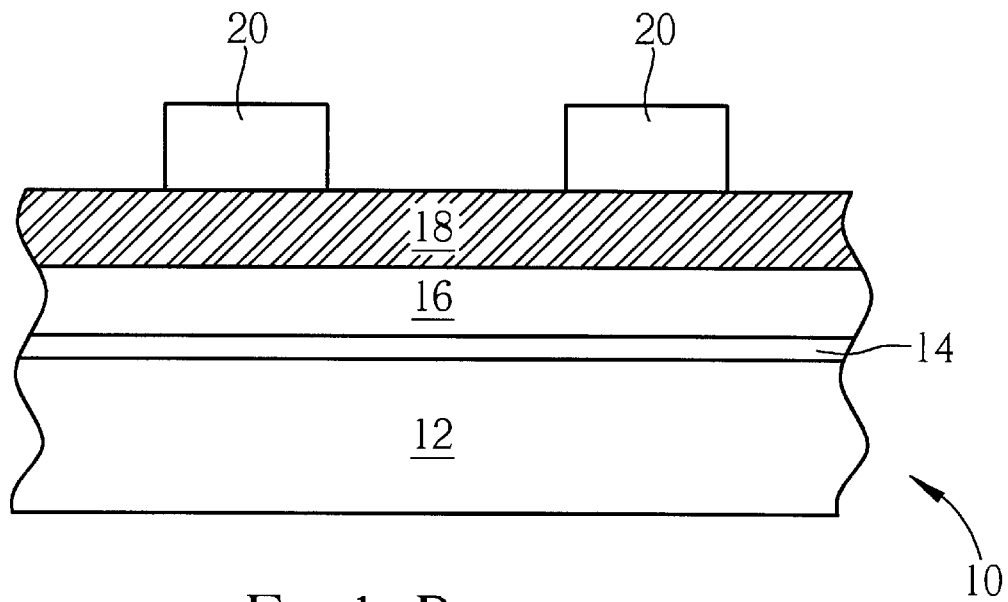
FIG. 1 and FIG. 2 are cross-sectional diagrams of a method for defining a gate electrode on a semiconductor wafer.
Figure 2:
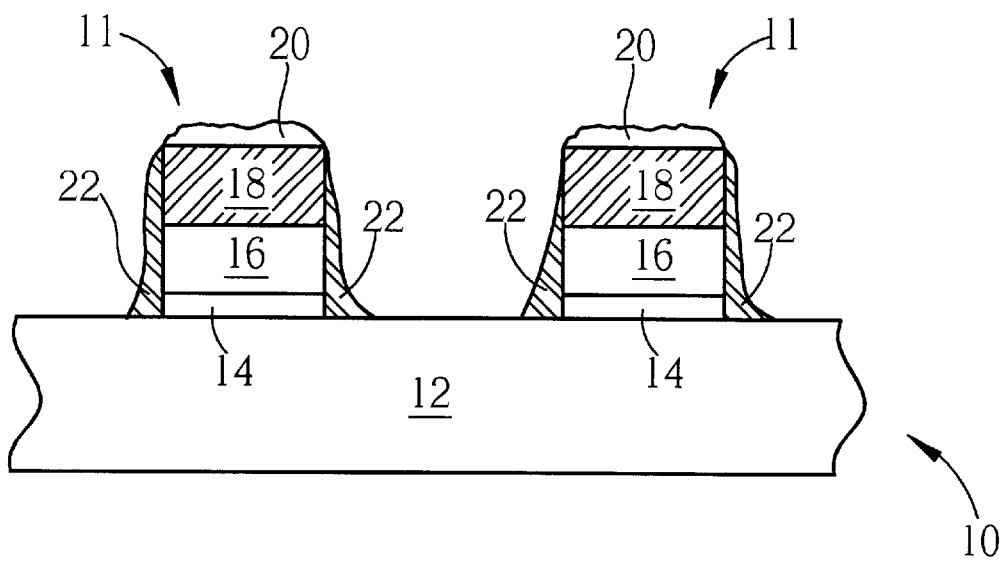
Figure 3:
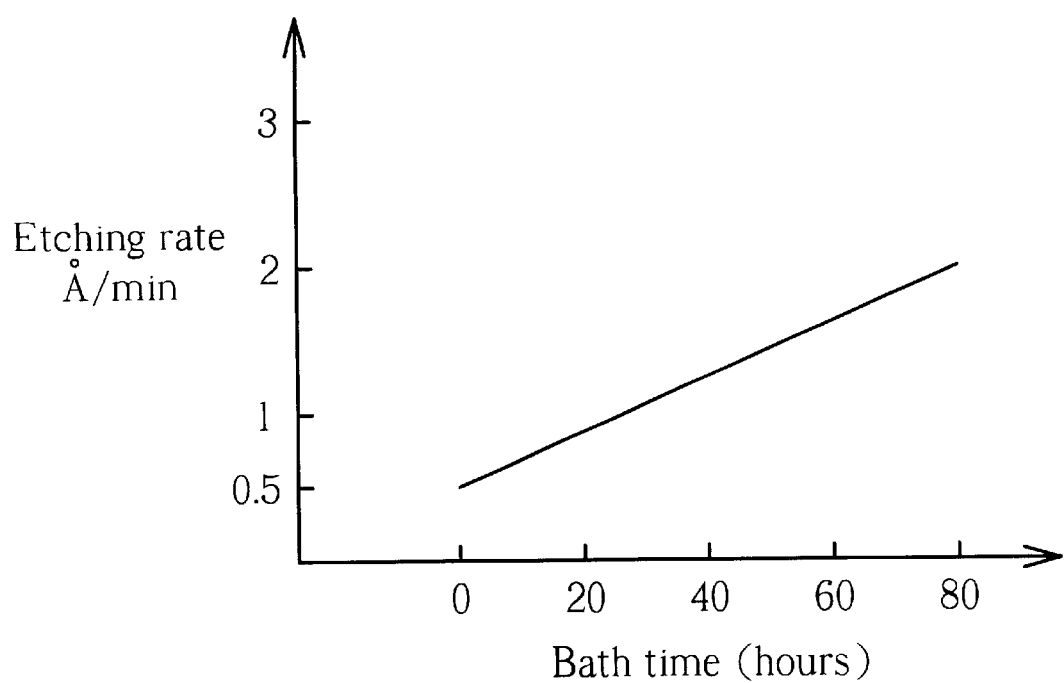
FIG. 3 depicts the relationship of thermal oxide etching rate on a monitor wafer versus bath time.
Figure 4:
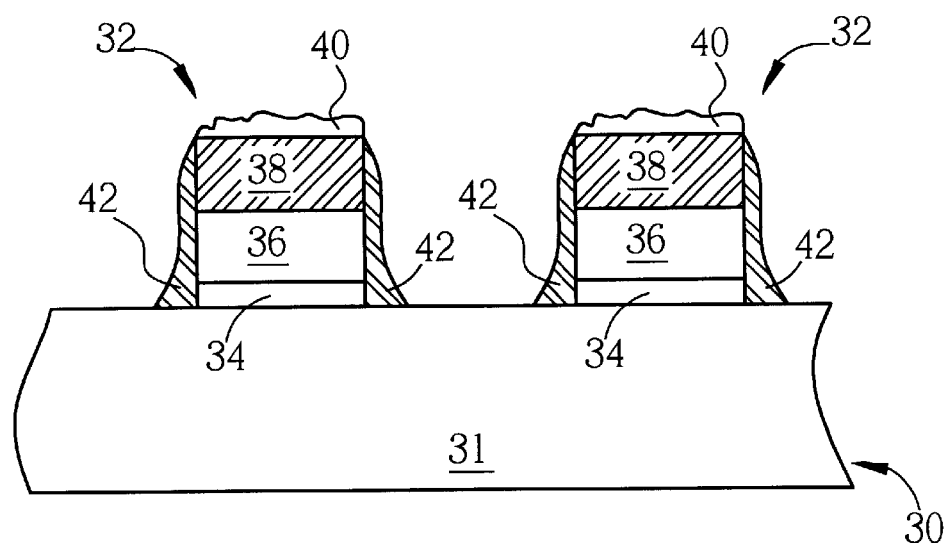
FIG. 4 is a cross-sectional diagram of a semiconductor wafer after forming gate electrodes according to the present invention.

Please refer to FIG. 4. FIG. 4 is a cross-sectional diagram of a semiconductor wafer 30 after forming gate electrodes 32 according to the present invention. The surface of a silicon substrate 31 of the semiconductor wafer 30 comprises a plurality of defined gate electrodes 32 and a photo-resist layer 40 on each defined gate electrode 32. Each gate electrode 32 comprises a gate oxide layer 34 on the surface of the silicon substrate 31, a polysilicon layer 36 on the gate oxide layer 34, and a silicide layer 38 on the polysilicon layer 36. The photo-resist layer 40 is used to define the patterns of the gate electrodes 32 and acts as a hard mask during the gate-defining dry etching process. Residual polymers 42, by-products of the manufacturing process, adhere to the gate electrodes 32 and to the surface of the substrate 31.

Figure 5:
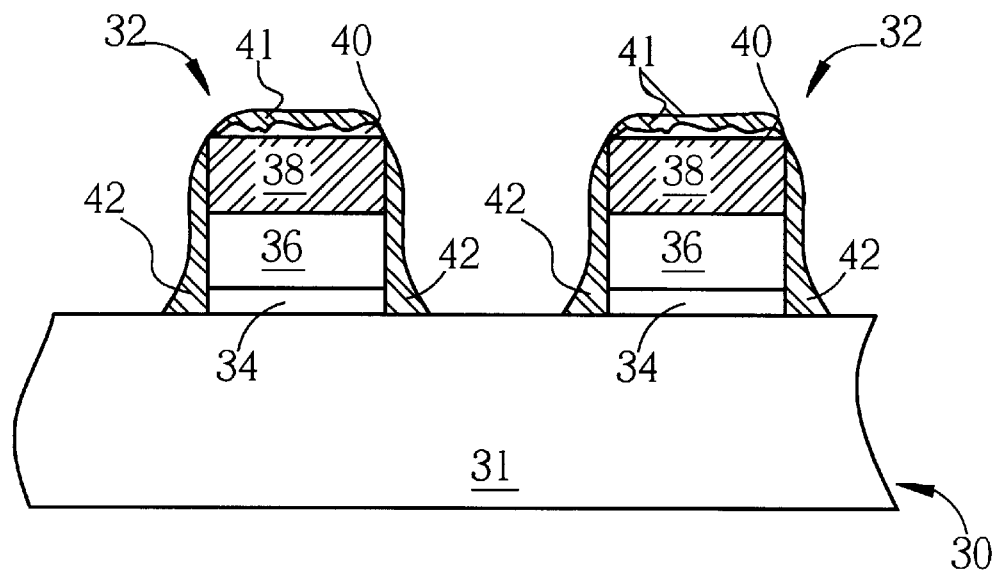
FIG. 5 is a cross-sectional diagram of a semiconductor wafer after performing a plasma ashing process according to the present invention.

Please refer to FIG. 5. FIG. 5 is a cross-sectional diagram of the semiconductor wafer 30 after performing a plasma ashing process according to the present invention. According to the present invention, a plasma ashing process is initially performed in a chamber that contains oxygen and carbon tetrafluoride ($CF_4$) to remove most of the photo-resist layer 40, as well as a portion of the residual polymers 42. Strong electric and magnetic fields are used to excite oxygen and carbon tetrafluoride ($CF_4$) to a plasma state in the chamber. Such a plasma is a powerful oxidizer and will oxidize and decompose most of the photo-resist layer 40, which is basically made of hydrocarbons, and a portion of the residual polymers 42 into gaseous CO, $CO_2$, and $H_2O$. This gaseous CO, $CO_2$ and $H_2O$ is immediately extracted using a vacuum system (not shown). At this phase, however, the photo-resist layer 40 is in fact not totally removed, since trace amounts of polymers 41 form during the plasma ashing process and cover the remaining photo-resist layer. Thus, after the plasma ashing process, the remaining photo-resist layer 40 having a thickness of about 10 angstroms to several hundred angstroms is usually observed.

Figure 6:
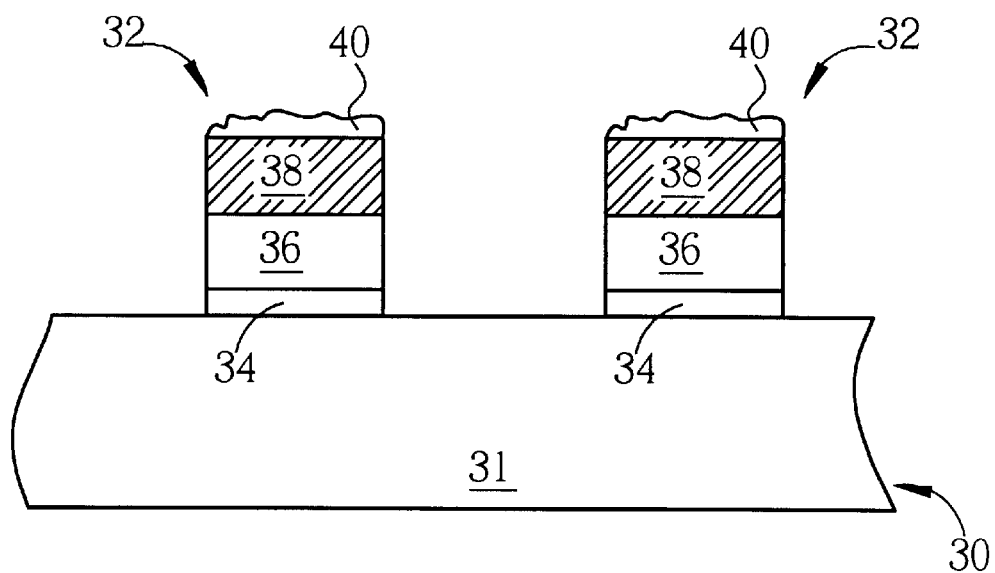
FIG. 6 is a cross-sectional diagram of a semiconductor wafer after performing a wet cleaning process according to the present invention.

Please refer to FIG. 6. FIG. 6 is a cross-sectional diagram of the semiconductor wafer 30 after performing a wet cleaning process according to the present invention. The wet cleaning process comprises ozone-containing deionized (DI) water, an amine-based solvent and a fluoride-based solvent. Preferably, the concentration of ozone dissolved in the DI water is between 30 to 45 ppm (parts per million). As earlier mentioned, in order to prevent over-etching of the silicon oxide in the test key on the street so as to control the quality of the cleaning process, the amine-based solvent, substantially comprising hydroxyl amine ($NH_2OH$), is first used to clean the surface of the semiconductor wafer 30. The ozone-containing deionized (DI) water is then evenly sprayed onto the surface of the semiconductor wafer 30 for about 3 to 12 seconds to remove the polymers 41 and polymers 42. The polymers 41 and polymers 42 illustrated in FIG. 5 are further oxidized and decomposed into $CO_2$, $H_2O$ and other small, oxidized molecules owing to the strong oxidation ability of ozone dissolved in DI water. Thereafter, optionally, the amine-based solvent is applied again to dissolve these small, oxidized molecules. Ultra-high purity DI water is then used to wash the surface of the semiconductor wafer 30 and remove from it the amine-based solvent and decomposed residual polymers. Finally, the fluoride-based solvent, substantially comprising ammonium fluoride ($NH_4F$), is used to fast rinse the surface of the semiconductor wafer 30 for about 5 to 25 seconds. After that, ultra-high purity DI water is again used to remove the fluoride-based solvent. As seen in FIG. 6, only a trace of the photo-resist layer 40 remains on the top of the gate electrodes 32 after performing the wet cleaning process according to this invention.

Figure 7:
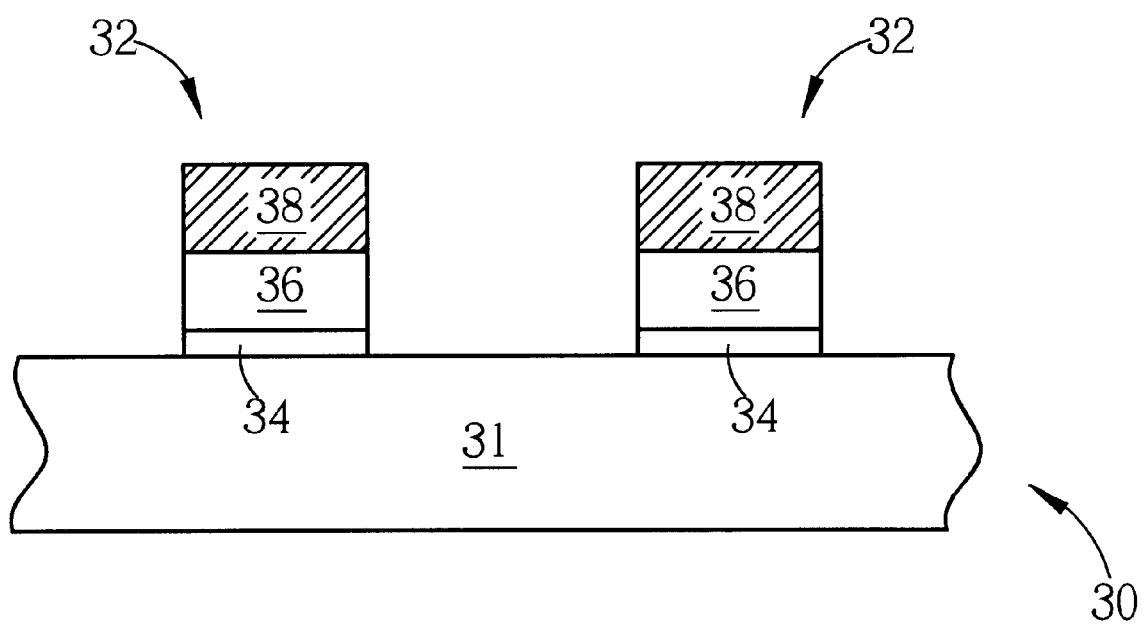
FIG. 7 is a cross-sectional diagram of a semiconductor wafer after performing an oxygen plasma cleaning process according to the present invention.

In order to completely remove these trace portions of the photo-resist layer 40 from the surface of the semiconductor wafer 30, an oxygen plasma cleaning process is performed. Please refer to FIG. 7. FIG. 7 is a cross-sectional diagram of the semiconductor wafer 30 after performing the oxygen plasma cleaning process according to the present invention. As shown in FIG. 7, the trace portions of the photo-resist layer 40 are completely decomposed by the oxygen plasma and removed using the vacuum system, thereby forming a clean surface on the semiconductor wafer 30.

In contrast to the prior art method for cleaning the surface of the semiconductor wafer 30, the present invention discloses an effective, non-damaging semiconductor wafer cleaning process. The cleaning process according to the present invention provides a wet cleaning process comprising an ozone-containing deionized (DI) water cleaning procedure, an amine-based solvent cleaning procedure and a fluoride-based solvent cleaning procedure. It is advantageous to use the cleaning process according to the present invention, since the mild amine-based solvent removes the trace organic compounds on the surface of the semiconductor wafer 30 without etching the silicon oxide of the street. The polymers 41 and polymers 42 illustrated in FIG. 5 are oxidized and decomposed into $CO_2$, $H_2O$ and other small, oxidized molecules owing to the strong oxidation ability of ozone dissolved in DI water. In addition, the oxygen and carbon tetrafluoride plasma, because of its strong oxidation abilities, also contributes to the removal of any trace portions of the residual photo-resist layer 40, 41. Furthermore, fast fluoride-based solvent rinsing on the surface of the semiconductor wafer 30 ensures the thickness of the silicon oxide in the test key falls in the criteria range.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for cleaning the surface of a semiconductor wafer without over-etching a silicon oxide layer in a test key, the semiconductor wafer comprising a plurality of defined gate electrodes on the surface of the semiconductor wafer and a photo-resist layer on each of the defined gate electrodes, the method comprising:

removing most of the photo-resist layer from the surface of the semiconductor wafer by a first oxygen plasma cleaning process;

cleaning the surface of the semiconductor wafer with an ozone-containing deionized water;

cleans the surface of the semiconductor using a mild amine-based solvent containing no fluoride compound to completely remove the remaining trace photo-resist layer after the ozone treatment, without affecting the deposition thickness of the silicon oxide in the test key; and quick-rinsing the surface of the semiconductor wafer using a fluoride-based solvent to ensure that the thickness of the silicon oxide in the test key falls within a criteria range but without corroding the gate electrodes; wherein the pH value of the mild amine-based solvent is independent from the bath time of the semiconductor wafer, and thereby obtaining a stable etching rate of the silicon oxide in the test key.

2. The method of claim 1 wherein the gate electrodes are defined by an anisotropic dry etching process, each of the gate electrodes comprising a gate oxide layer on the surface of the semiconductor wafer, a polysilicon layer on the gate oxide layer, and a silicide layer on the polysilicon layer.

3. The method of claim 2 wherein the photo-resist layer acting as a hard mask during the anisotropic dry etching process is used to define the pattern of the gate electrode.

4. The method of claim 1 wherein after quick-rinsing the surface of the semiconductor wafer using a fluoride-based solvent, the method further comprises a second oxygen plasma cleaning process used to remove the remaining photo-resist layer on each of the gate electrodes.

5. The method of claim 1 wherein the first oxygen plasma cleaning process is performed in an $O_2/CF_4$ atmosphere.

6. The method of claim 1 wherein the ozone-containing deionized water has an ozone concentration of about 30 to 45 ppm.

7. The method of claim 1 wherein the amine-based solvent comprises hydroxyl amine ($NH_2OH$).

8. The method of claim 1 wherein the fluoride-based solvent comprises ammonium fluoride ($NH_4F$).

9. A method for removing photo-resist and polymer residues from the surface of a semiconductor wafer without over-etching a silicon oxide layer in a test key, the method comprising:

performing a plasma ashing process on the surface of the semiconductor wafer;

cleaning the surface of the semiconductor wafer by using a mild amine-based solvent, having a stable pH value, wherein the mild amine-based solvent contains no fluoride compound;

cleaning the surface of the semiconductor wafer using an ozone-containing deionized water quick-rinsing the surface of the semiconductor wafer using a fluoride-based solvent to control the thickness of the silicon oxide layer in the test key; and performing an oxygen plasma cleaning process on the surface of the semiconductor wafer.

10. The method of claim 9 wherein the semiconductor wafer comprises a plurality of gate electrodes, each of the gate electrodes comprising a gate oxide layer on the surface of the semiconductor wafer, a polysilicon layer on the gate oxide layer, a silicide layer on the polysilicon layer, and a photo-resist layer lying on top of each of the gate electrodes, the photo-resist layer being used to define the pattern of the gate electrode.

11. The method of claim 10 wherein the silicide layer is composed of Ti-Polycide.

12. The method of claim 9 wherein the plasma ashing process is performed in an $O_2/CF_4$ atmosphere.

13. The method of claim 9 wherein the amine-based solvent comprises hydroxyl amine ($NH_2OH$).

14. The method of claim 1 wherein the fluoride-based solvent comprises ammonium fluoride ($NH_4F$).

15. The method of claim 9 wherein the concentration of ozone dissolved in the deionized water is between 30 to 45 ppm.

16. The method of claim 9 wherein the surface of the semiconductor wafer is cleaned by the ozone-containing deionized water for 3 to 12 seconds.

* * * * *